United States Patent [19]
Bovenkerk et al.

[11] Patent Number: 5,540,904
[45] Date of Patent: Jul. 30, 1996

[54] ISOTOPICALLY-PURE CARBON-12 OR CARBON-13 POLYCRYSTALLINE DIAMOND POSSESSING ENHANCED THERMAL CONDUCTIVITY

[75] Inventors: Harold P. Bovenkerk, Worthington, Ohio; Thomas R. Anthony, Schenectady, N.Y.; James F. Fleischer, Scotia, N.Y.; William F. Banholzer, New York, N.Y.

[73] Assignee: General Electric Company, Worthington, Ohio

[21] Appl. No.: 368,732

[22] Filed: Jan. 4, 1995

Related U.S. Application Data

[63] Continuation of Ser. No. 88,490, Jul. 7, 1993, abandoned, which is a continuation of Ser. No. 727,016, Jul. 8, 1991, abandoned, which is a continuation-in-part of Ser. No. 536,371, Jun. 11, 1990, abandoned, which is a continuation-in-part of Ser. No. 448,469, Dec. 11, 1989, abandoned.

[51] Int. Cl.$^6$ .................................................. C01B 31/06
[52] U.S. Cl. .......................................... 423/446; 117/929
[58] Field of Search ............................. 423/446; 501/86; 117/929, 105; 427/596

[56] References Cited

U.S. PATENT DOCUMENTS

| | | | |
|---|---|---|---|
| 3,850,591 | 11/1974 | Wentorf | 51/307 |
| 4,707,384 | 11/1987 | Schachner et al. | 427/249 |
| 4,740,263 | 4/1988 | Imai et al. | 156/DIG. 68 |
| 4,767,608 | 8/1988 | Matsumoto et al. | 156/DIG. 68 |
| 4,985,227 | 1/1991 | Ito et al. | 156/DIG. 68 |
| 5,094,915 | 3/1992 | Subramaniam | 423/446 |

FOREIGN PATENT DOCUMENTS

| | | | |
|---|---|---|---|
| 206820 | 12/1986 | European Pat. Off. | 423/446 |
| WO9009465 | 8/1990 | WIPO . | |

OTHER PUBLICATIONS

Seitz, "Isotopic Enhancement of Thermal Conductivity and Damage Thresholds in Diamond" Papers given Feb. 6, 1987, at Lincoln Laboratories.

*Primary Examiner*—Robert Kunemund

[57] ABSTRACT

Broadly, the present invention is directed to polycrystalline diamond of improved thermal conductivity. The novel polycrystalline diamond consists essentially of at least 99.5 wt-% isotopically-pure carbon-12 or carbon-13. The inventive polycrystalline diamond is formed from at least 99.5 wt-% isotopically-pure carbon-12 or carbon-13. Single-crystal isotopically-pure carbon-12 and carbon-13 diamond are known to possess improved thermal conductivity. Polycrystalline diamond, however, possesses lower thermal conductivity patterns deleteriously impacted by, for example, impurities, isotopic effects, and grain boundary scattering. In fact, grain boundary scattering would lead the skilled artisan to believe that the thermal conductivity of polycrystalline diamond would be substantially unaffected by the isotopic nature of the diamond itself. Unexpectedly, however, isotopic effects were discovered to predominate in impacting the thermal conductivity of polycrystalline diamond consisting essentially of isotopically-pure carbon-12 or carbon-13. This is true whether the isotopically-pure polycrystalline diamond is grown directly or whether individual isotopically-pure carbon-12 or carbon 13 diamond crystals are subjected to sintering for forming a polycrystalline structure, e.g. layer or compact, thereof.

2 Claims, No Drawings

ISOTOPICALLY-PURE CARBON-12 OR CARBON-13 POLYCRYSTALLINE DIAMOND POSSESSING ENHANCED THERMAL CONDUCTIVITY

CROSS-REFERENCE TO RELATED APPLICATIONS

This is a continuation of Ser. No. 08/088,490 filed on July 7, 1993, now abandoned; which is a continuation of Ser. No. 07/727,016, filed on July 8, 1991, now abandoned; which is a continuation-in-part of Ser. No. 07/536,371, filed on June 11, 1990, now abandoned; which is a continuation-in-part of Ser. No. 07/448,469, filed Dec. 11, 1989, also now abandoned.

BACKGROUND OF THE INVENTION

The present invention relates to the preparation of polycrystalline diamond and more particularly to polycrystalline diamond possessing enhanced thermal conductivity.

High thermal conductivity diamond, such as high quality selected type II natural diamond, is characterized by a very high degree of purity and is reported to have a thermal conductivity at 25° C. (298° K) on the order of about 21 watt/cm °K. Such high thermal conductivity diamond is useful, for example, as a heat sink material, such as in the backing of semi-conductors. Despite its high costs, type II natural diamond has been employed as a heat sink material because it has the highest thermal conductivity of diamonds. Conventionally-produced high pressure/high temperature (HP/HT) synthetic high quality, low nitrogen type II diamonds can be produced with a similarly high thermal conductivity. For the most part, diamonds prepared by low-pressure chemical vapor deposition (CVD) processes are not single crystal diamond and have materially lower thermal conductivities, typically on the order of 12 watts/cm °K at about 300° K (hereinafter sometimes referred to as "room temperature conductivity").

Since diamond is usually an electrical insulator, i.e. electrically non-conducting, heat is conducted by phonons. Anything that shortens the phonon mean free path (i.e. lattice vibration modes) degrades thermal conductivity. In 98% of natural diamonds (type Ia), nitrogen impurities scatter phonons. This reduces the mean free phonon path and, thus, the thermal conductivity, to near 8 watts/cm °K. In polycrystalline diamond typical of that made by CVD processes, there are many defects, such as, for example, twins, grain boundaries, vacancies, and dislocations, that reduce the phonon mean free path. The thermal conductivity of CVD diamond is remarkable in one sense in that it is about 60% of the thermal conductivity of highly perfect diamond.

With respect to polycrystalline diamond (in film, compact, or other form), thermal conductivity is known to be affected by, for example, impurities, isotopic effects, and grain boundary scattering, to name just a few factors. In fact, grain boundary scattering has been believed to be dominant in the lower thermal conductivity of polycrystalline diamond compared to single crystal diamond. Enhancement of the thermal conductivity of polycrystalline diamond, then, is a need that yet exists in the art.

BROAD STATEMENT OF THE INVENTION

Broadly, the present invention is directed to polycrystalline diamond of improved thermal conductivity. The novel polycrystalline diamond consists essentially of at least 99.5 wt-% isotopically-pure carbon-12 or carbon-13. The inventive polycrystalline diamond is formed from at least 99.5 wt-% isotopically-pure carbon-12 or carbon-13.

Single-crystal isotopically-pure carbon-12 and carbon-13 diamond are known to possess improved thermal conductivity. Polycrystalline diamond, however, possesses thermal conductivity patterns deleteriously impacted by, for example, impurities, isotopic effects, and grain boundary scattering. In fact, grain boundary scattering would lead the skilled artisan to believe that the thermal conductivity of polycrystalline diamond would be substantially unaffected by the isotopic nature of the diamond itself. Unexpectedly, however, isotopic effects were discovered to predominate in impacting the thermal conductivity of polycrystalline diamond consisting essentially of isotopically-pure carbon-12 and carbon-13. This is true whether the isotopically-pure polycrystalline diamond is grown directly or whether individual isotopically-pure carbon-12 or carbon-13 diamond crystals are subjected to sintering for forming a polycrystalline structure, e.g. layer or compact, thereof.

DETAILED DESCRIPTION OF THE INVENTION

Heat conductivity in diamond is quite complicated, especially considering the parallel and series paths that it can take. It should be understood that theories on heat conductivity in diamond, then, are inconsistent in the literature and, likely, are incomplete. Thus, much of the theory expounded herein should be interpreted accordingly. Regardless of the theories expounded herein, synthesis of polycrystalline carbon-12 and carbon-13 has been achieved and the unexpected thermal conductivity confirmed.

The description that follows is directed particularly to $^{12}$C diamond, but it holds equally true for $^{13}$C diamond as well. Since diamond is an insulator, heat is conducted by phonons. Equation I, below, sets forth the thermal conductivity of polycrystalline diamond in terms of the specific heat (C), phonon velocity (V), and mean free path of phonons ($\lambda$).

$$K = (1/3)CV\lambda, \text{ or } K \sim CV\lambda \qquad (I)$$

It has been shown previously that both the specific heat and the phonon velocity (the sound velocity) are the same in high quality diamond and diamond made by chemical vapor deposition (CVD) techniques. Consequently, all the variation in thermal conductivity between different grades of diamond occurs because of differences in the mean free path of phonons in different grades of diamond. The mean free path of a phonon is given by the following equation:

$$1/\lambda = 1/\lambda \text{ phonon-phonon} + 1/\lambda \text{ grain-boundaries} + 1/\lambda \text{ dislocations} + 1/\lambda \text{ vacancies} + 1/\lambda \text{ impurities} + 1/\lambda \text{ isotopes} + \ldots, \qquad (II)$$

where, scattering caused by phonon-phonon interactions, grain boundaries, dislocations, vacancies, impurities, and isotopes are included explicitly, while other possible scattering centers (e.g., small voids) are represented by "...".

Estimates of some of the phonon mean free path length from thermal diffusivity data of natural isotope abundance high quality diamond and isotopically pure high quality diamond can be made. The average phonon velocity at room temperature in diamond is equal to the sound velocity of $1.38 \times 10^6$ cm/sec. The specific heat of diamond at room temperature is reported to be 6.195 joules/g. For isotopically-pure high quality diamond, the phonon mean free path is limited principally by a phonon-phonon scattering. From equation I, we find that $\lambda$, phonon-phonon is 0.17 microns.

For natural isotope abundance high quality diamond, the phonon mean free path is determined by both phonon-phonon and phonon-isotope scattering, and is equal to 0.09 microns. From this value and equation II, we can derive the mean free path of isotope scattering $\lambda$ isotopes to be 0.19 microns.

For polycrystalline CVD diamond, additional phonon scattering centers come into play and the thermal conductivity is decreased to approximately 12 watts/cm $-°K$, which gives a phonon mean free path of 0.05 microns. Several observations about the magnitude of this phonon mean free path should be made. First, elimination of scattering centers, which are much more widely spaced than 0.05 microns, will not affect the thermal conductivity according to equation II. Thus, elimination of grain boundaries in CVD or other polycrystalline diamond material having a grain size of 10 microns, for example, will only increase the thermal conductivity by 0.5%.

Secondly, although elimination of grain boundaries by using epitaxial growth on diamond or heteroepitaxial growth on a foreign substrate will not affect the thermal conductivity, such growth may lead to a lower concentration of dislocations by starting with perfect seed crystals and thereby increase the thermal conductivity. From etch pitch studies it has been estimated that the dislocation density in typical CVD diamond material exceeds $10^8$ dislocations/$cm^2$. The phonon mean free path from scattering off of dislocations should be less than I micron. Elimination of all dislocations should increase the thermal conductivity by greater than 5%.

A reduction in the numbers of gain boundaries can be achieved through the control of nucleation during the initial stages of diamond growth. This can be accomplished by a variety of means. Heteroepitaxy would allow single crystal films, if successful. Even if polycrystalline material was formed, it would have fewer gain boundaries than standard CVD diamond gown on Si, Mo, etc. Suitable substrates for heteroepitaxy would be Ni, Cu/Ni alloys, CBN (cubic boron nitride), and CBN films gown epitaxially on Si. Another approach is to seed the substrate with diamonds. Using CVD diamond to grow homoepitaxially, it should be possible to control the orientation gain boundaries of the film. Reducing the gain boundaries and the dislocation density would eliminate phonon scattering and increase the thermal conductivity of the resulting film. The preferred polycrystalline diamond formed is one crystallite thick.

Probably the largest scatter of phonons and CVD diamond are vacancies and vacancy clusters. Because CVD diamond is deposited at a temperature of about 900° C., which is less than ¼ the melting temperature of diamond, there is not much solid-state diffusion during deposition. This lack of defect mobility causes a large amount of atomic defects, such as vacancies, to be frozen during growth. Current CVD technology, however, militates against improving this condition.

One scattering center that is easily removable from CVD diamond are carbon-13 isotopes when making isotopically-pure carbon-12 (and carbon-12 isotopes when making isotopically-pure carbon-13). Knowing the mean free path of isotope scattering, equation II can be used to estimate the change in thermal conductivity that can be expected by eliminating unwanted isotopes from conventional CVD material with a thermal conductivity of 12 watts/cm $-°K$. Deletion of $\lambda$ isotopes equals 0.19 microns in equation II and substitution of the enhanced $\lambda$ in equation I shows that the thermal conductivity of CVD diamond should increase from 12 to 15 watts/cm $-°K$ when it is made of isotopically pure carbon-12. The thermal conductivity for isotopically-pure carbon-13 similarly should increase to around 15 watts/cm $-°K$.

Laser flash diffusivity IR detection system data was generated from about 0.5 mm thick disks of CVD diamond which was greater than 99.5 wt-% isotopically pure carbon-12. One side of the disk was blackened and a laser pulse impacted thereon. Diffusivity or the time rate of temperature decay, was detected by an infrared detector on the reverse side of the sample. The measurement was made at room temperature, viz., 25° C. A natural abundance isotope sample also was tested. The natural isotope sample tested at 8 watts/cm $-°C$. while the isotopically pure sample tested at 12 watts/cm $-°C$. Thus, the thermal conductivity of polycrystalline isotopically pure carbon-13 material unexpectedly has a much higher thermal conductivity than the polycrystalline diamond made from natural abundance isotopes. The value of the thermal conductivity can only be improved by paying attention to dislocations, vacancies, vacancy clusters, and like factors that tend to depress the thermal conductivity of the polycrystalline diamond pieces. Controlling grain boundaries also is important as obvious loss of thermal conductivity is experienced, though not nearly to the degree with isotopically pure polycrystalline diamond than with natural isotope abundant polycrystalline diamond.

As noted above, the isotopically-pure polycrystalline diamond can be grown by CVD techniques, or can be grown by high pressure/high temperature (HP/HT) techniques including growing the polycrystalline diamond directly, or growing the polycrystalline diamond and then sintering the diamond to form an appropriate piece. Though HP/HT techniques are well known in the art, reference to the following patents provides details on such processing conditions: U.S. Pat. No. 3,141,746; 3,381,428; 3,609,818; 3,745,623; 3,831,428; and 3,850,591, the disclosures of which are expressly incorporated herein by reference.

With respect to conventional CVD processes useful in the present invention, hydrocarbon/hydrogen gaseous mixtures are fed into a CVD reactor as an initial step. Hydrocarbon sources can include the methane series gases, e.g. methane, ethane, propane; unsaturated hydrocarbons, e.g. ethylene, acetylene, cyclohexene, and benzene; and the like. Methane, however, is preferred. Use of either carbon-12 or carbon-13 for these hydrocarbon sources is made in accordance with the precepts of the present invention. The molar ratio of hydrocarbon to hydrogen broadly ranges from about 1:10 to about 1:1,000 with about 1:100 being preferred. This gaseous mixture optionally may be diluted with an inert gas, e.g. argon. The gaseous mixture is at least partially decomposed thermally by one of several techniques known in the art. One of these techniques involves the use of a hot filament which normally is formed of tungsten, molybdenum, tantalum, or alloys thereof. U.S. Pat. No. 4,707,384 illustrates this process.

The gaseous mixture partial decomposition also can be conducted with the assistance of d.c. discharge or radio frequency electromagnetic radiation to generate a plasma, such as proposed in U.S. Pats. Nos. 4,749,587, 4,767,608, and 4,830,702; and U.S. Pat. No. 4,434,188 with respect to use of microwaves. The substrate may be bombarded with electrons during the CVD decomposition process in accordance with U.S. Pat. No. 4,740,263.

Regardless of the particular method used in generating the partially decomposed gaseous mixture, the substrate is maintained at an elevated CVD diamond-forming temperature which typically ranges from about 500° to 1100° C. and preferably in the range of about 850° to 950° C. where diamond growth is at its highest rate in order to minimize grain size. Pressures in the range of from about 0.01 to 1000 Torr, advantageously about 100–800 Torr, are taught in the art, with reduced pressure being preferred. Details on CVD processes additionally can be reviewed by reference to Angus, et al., "Low-Pressure, Metastable Growth of Diamond and 'Diamondlike' Phases", *Science,* vol. 241, pages 913–921 (Aug. 19, 1988); and Bachmann, et al., "Diamond Thin Films", *Chemical and Engineering News,* pages 24–39 (May 15, 1989). The disclosures of all citations herein are expressly incorporated herein by reference.

We claim:

1. Polycrystalline chemically vapor deposited (CVD) polycrystaline diamond film of improved thermal conductivity which consists essentially of at least 99.5 wt-% isotopically-pure carbon-12 and wherein said thermal conductivity is substantially improved.

2. A polycrystalline chemically vapor deposited (CVD) diamond layer according to claim 1 having a thickness of at least about 0.5 mm.

\* \* \* \* \*